United States Patent
Nguyen et al.

(10) Patent No.: US 12,041,738 B2
(45) Date of Patent: Jul. 16, 2024

(54) ELECTRONIC DEVICES WITH DURABLE FOLDING DISPLAYS

(71) Applicant: Apple Inc., Cupertino, CA (US)

(72) Inventors: Que Anh S. Nguyen, San Jose, CA (US); Michael B. Wittenberg, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 52 days.

(21) Appl. No.: 17/538,557

(22) Filed: Nov. 30, 2021

(65) Prior Publication Data
US 2022/0225523 A1    Jul. 14, 2022

Related U.S. Application Data

(60) Provisional application No. 63/136,981, filed on Jan. 13, 2021.

(51) Int. Cl.
| | |
|---|---|
| *H05K 5/03* | (2006.01) |
| *H05K 5/00* | (2006.01) |
| *H05K 5/02* | (2006.01) |
| *H10K 77/10* | (2023.01) |
| *H10K 102/00* | (2023.01) |

(52) U.S. Cl.
CPC .............. *H05K 5/03* (2013.01); *H05K 5/0017* (2013.01); *H05K 5/0226* (2013.01); *H10K 77/111* (2023.02); *H10K 2102/311* (2023.02)

(58) Field of Classification Search
CPC ....... H05K 5/03; H05K 5/0017; H05K 5/0226
See application file for complete search history.

(56) References Cited

U.S. PATENT DOCUMENTS

| | | | |
|---|---|---|---|
| 8,773,848 B2 | 7/2014 | Russell-Clarke et al. | |
| 9,189,027 B2 | 11/2015 | Lee et al. | |
| 9,460,644 B2* | 10/2016 | Namkung | G06F 1/1652 |
| 9,516,743 B2 | 12/2016 | Kim et al. | |
| 9,773,853 B2* | 9/2017 | Tao | H10K 59/122 |
| 9,811,120 B2* | 11/2017 | Namkung | G06F 1/1652 |
| 9,848,494 B2 | 12/2017 | Huitema et al. | |
| 9,935,279 B2 | 4/2018 | Lee et al. | |
| 10,020,462 B1* | 7/2018 | Ai | H10K 50/841 |
| 10,056,444 B2* | 8/2018 | Cho | H10K 59/131 |
| 10,069,107 B2* | 9/2018 | Jeon | H10K 50/844 |
| 10,104,787 B2 | 10/2018 | Rothkopf et al. | |

(Continued)

*Primary Examiner* — Rockshana D Chowdhury
*Assistant Examiner* — Douglas R Burtner
(74) *Attorney, Agent, or Firm* — Treyz Law Group, P.C.; G. Victor Treyz; Jinie M. Guihan

(57) ABSTRACT

A foldable display may have a display cover layer and a flexible display panel. The foldable display may bend around a bend axis. The display panel may have an array of pixels configured to display an image through the display cover layer. The display cover layer may be formed from a layer of glass. A recess may be formed in the layer of glass that extends along the bend axis. The recess may form a flexible locally thinned portion in the layer of glass that allows the glass layer to bend about the bend axis. To ensure that the display cover layer exhibits satisfactory impact resistance during drop events, corner portions of the display cover layer and other edge portions of the display cover layer may be provided with greater thickness relative to other portions of the display cover layer outside of the locally thinned portion.

20 Claims, 13 Drawing Sheets

(56) References Cited

U.S. PATENT DOCUMENTS

| | | | |
|---|---|---|---|
| 10,303,218 B2 * | 5/2019 | Jones | G06F 1/1652 |
| 10,429,895 B2 * | 10/2019 | Lee | G06F 1/1643 |
| 10,462,896 B1 | 10/2019 | Kwon et al. | |
| 10,600,989 B1 * | 3/2020 | Ai | H10K 50/841 |
| 10,804,348 B2 * | 10/2020 | Kim | H10K 71/00 |
| 10,915,144 B2 * | 2/2021 | Namkung | G06F 1/1652 |
| 11,081,660 B2 * | 8/2021 | Lee | B32B 27/08 |
| 11,258,044 B2 * | 2/2022 | Kwon | H10K 71/135 |
| 11,380,869 B2 * | 7/2022 | Yu | H10K 71/00 |
| 11,395,415 B2 * | 7/2022 | Gu | G06F 1/1601 |
| 11,436,854 B2 * | 9/2022 | Ha | G06V 40/12 |
| 11,569,478 B2 * | 1/2023 | Seo | H10K 59/124 |
| 11,625,120 B2 * | 4/2023 | Lee | G06F 3/04164 |
| | | | 345/173 |
| 11,633,943 B2 * | 4/2023 | Lv | B32B 3/18 |
| | | | 428/201 |
| 2006/0146488 A1 | 7/2006 | Kimmel | |
| 2013/0083496 A1 | 4/2013 | Franklin et al. | |
| 2013/0169515 A1 * | 7/2013 | Prushinskiy | H10K 50/844 |
| | | | 345/55 |
| 2015/0146386 A1 * | 5/2015 | Namkung | H05K 1/028 |
| | | | 361/749 |
| 2015/0313004 A1 * | 10/2015 | Namkung | G02F 1/133305 |
| | | | 361/749 |
| 2017/0045914 A1 * | 2/2017 | Namkung | G06F 1/1652 |
| 2017/0054106 A1 * | 2/2017 | Jeon | H10K 77/111 |
| 2017/0092884 A1 | 3/2017 | Zhang et al. | |
| 2017/0263887 A1 * | 9/2017 | Han | H10K 77/111 |
| 2019/0074469 A1 * | 3/2019 | Kwon | H05K 7/20963 |
| 2020/0163231 A1 | 5/2020 | Park | |
| 2020/0212340 A1 * | 7/2020 | Ai | H10K 50/841 |
| 2020/0233466 A1 | 7/2020 | Sanchez et al. | |
| 2020/0313111 A1 * | 10/2020 | Kim | H10K 50/87 |
| 2021/0004048 A1 * | 1/2021 | Ha | G09G 3/035 |
| 2021/0020078 A1 * | 1/2021 | Park | H10K 50/844 |
| 2021/0174710 A1 * | 6/2021 | He | G06F 1/1652 |
| 2022/0131103 A1 * | 4/2022 | Sung | H10K 59/124 |
| 2022/0199699 A1 * | 6/2022 | Lee | G06F 3/0443 |

* cited by examiner

ELECTRONIC DEVICES WITH DURABLE FOLDING DISPLAYS

This application claims the benefit of provisional patent application No. 63/136,981, filed Jan. 13, 2021, which is hereby incorporated by reference herein in its entirety.

FIELD

This relates generally to electronic devices, and, more particularly, to electronic devices with displays.

BACKGROUND

Electronic devices often have displays. Portability may be a concern for some devices, which tends to limit available real estate for displays.

SUMMARY

An electronic device may be provided with a foldable housing. The housing may have first and second portions that are coupled by a hinge for rotation about a bend axis.

A foldable display may be mounted to the foldable housing. The foldable display may have a display cover layer and a flexible display panel. The foldable display may bend around a bend axis. The display panel may have an array of pixels configured to display an image through the display cover layer.

The display cover layer may be formed from a layer of glass. A recess may be formed in the layer of glass that extends along the bend axis. The recess may form a flexible locally thinned portion in the layer of glass that allows the glass layer to bend about the bend axis. To ensure that the display cover layer exhibits satisfactory impact resistance during drop events, corner portions and other edge portions of the display cover layer may have increased thickness relative to other portions of the display cover layer outside of the locally thinned portion.

The hinge and/or other structures in the display may be configured to help hold the display flat when unfolded during normal use, while causing the display to slightly fold about the bend axis when the electronic device is jolted during a drop event. This helps prevent the display from impacting a hard surface while fully opened.

DETAILED DESCRIPTION

Electronic devices may be provided with displays. Displays may be used for displaying images for users. Displays may be formed from arrays of light-emitting diode pixels or other pixels. For example, a device may have an organic light-emitting diode display or a display formed from an array of micro-light-emitting diodes (e.g., light-emitting diodes formed from crystalline semiconductor dies).

Figure 1:
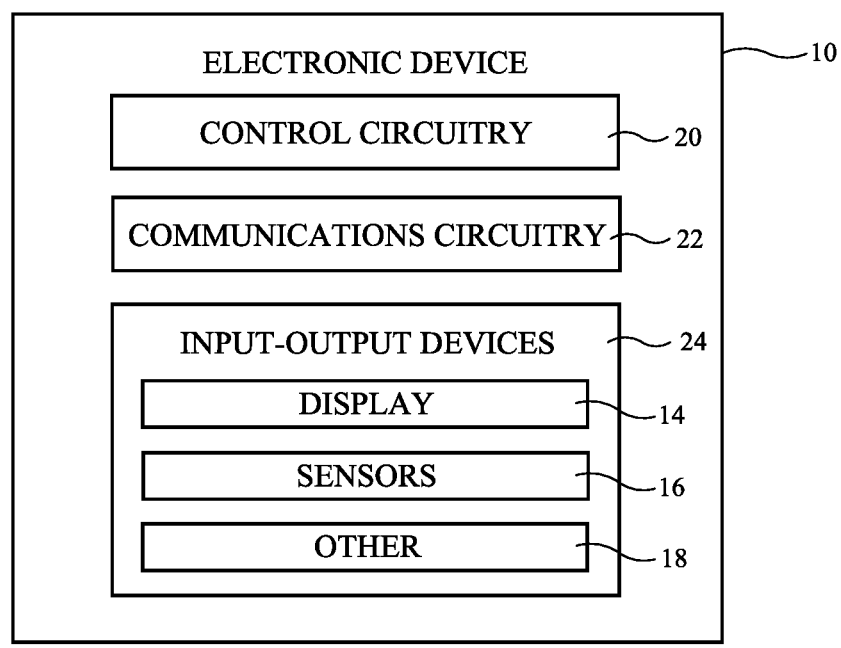
FIG. 1 is a schematic diagram of an illustrative electronic device in accordance with an embodiment.

A schematic diagram of an illustrative electronic device having a display is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment. Configurations in which device 10 is a cellular telephone, tablet computer, or other portable electronic device may sometimes be described herein as an example. This is illustrative. Device 10 may, in general, be any suitable electronic device with a display.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 20 may use a display and other output devices in providing a user with visual output and other output.

To support communications between device 10 and external equipment, control circuitry 20 may communicate using communications circuitry 22. Circuitry 22 may include antennas, radio-frequency transceiver circuitry (wireless transceiver circuitry), and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 6 GHz and 300 GHz, a 60 GHz link, or other millimeter wave link, cellular telephone link, wireless local area network link, personal area network communications link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Configurations in which display 14 is an organic light-emitting diode display or microLED display are sometimes described herein as an example.

Display 14 may have an array of pixels configured to display images for a user. The pixels may be formed as part of a display panel that is bendable. This allows device 10 to be folded and unfolded about a bend axis. For example, a flexible (bendable) display in device 10 may be folded so that device 10 may be placed in a compact shape for storage and may be unfolded when it is desired to view images on the display.

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
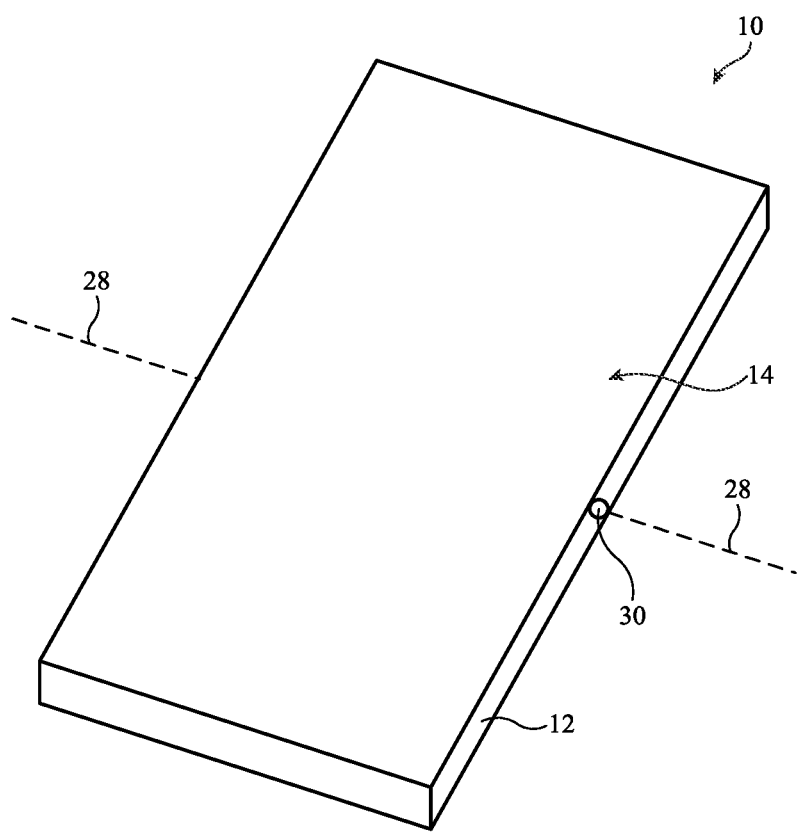
FIG. 2 is a perspective view of an illustrative electronic device with a display in accordance with an embodiment.

FIG. 2 is a perspective view of electronic device 10 in an illustrative configuration in which device 10 is a portable electronic device such as a cellular telephone or tablet computer. As shown in FIG. 2, device 10 may have a display such as display 14. Display 14 may cover some or all of the front face of device 10. Touch sensor circuitry such as two-dimensional capacitive touch sensor circuitry may be incorporated into display 14.

Display 14 may be mounted in housing 12. Housing 12 may form front and rear housing walls, sidewall structures, and/or internal supporting structures (e.g., a frame, an optional midplate member, etc.) for device 10. Glass structures, transparent polymer structures, and/or other transparent structures that cover display 14 and other portions of device 10 may provide structural support for device 10 and may sometimes be referred to as housing structures. For example, a transparent housing portion such as a glass or polymer housing structure that covers and protects a pixel array in display 14 may serve as a display cover layer for the pixel array while also serving as a housing wall on the front face of device 10. In configurations in which a display cover layer is formed from glass, the display cover layer may sometime be referred to as a display cover glass or display cover glass layer. The portions of housing 12 on the sidewalls and rear wall of device 10 may be formed from glass or other transparent structures and/or opaque structures. Sidewalls and rear wall structures may be formed as extensions to the front portion of housing 12 (e.g., as integral portions of the display cover layer) and/or may include separate housing wall structures.

Housing 12 may have flexible structures (e.g., bendable housing wall structures) and/or hinge structures such as hinge 30. Hinge 30 may have a hinge axis aligned with device bend axis 28. Hinge 30 and/or flexible housing structures that overlap bend axis 28 may allow housing 12 to bend about bend axis 28. For example, housing 12 may have a first portion on one side of bend axis 28 and a second portion on an opposing side of bend axis 28 and these two housing portions may be coupled by hinge 30 for rotational motion about axis 28.

As housing 12 is bent about bend axis 28, the flexibility of display 14 allows display 14 to bend about axis 28. In an illustrative configuration, housing 12 and display 14 may bend by 180°. This allows display 14 to be folded back on itself (with first and second outwardly-facing portions of display 14 facing each other). The ability to place device 10 in a folded configuration in this way may help make device 10 compact so that device 10 can be stored efficiently. When it is desired to view images on display 14, device 10 may be unfolded about axis 28 to place device 10 in the unfolded configuration of FIG. 2. This allows display 14 to lie flat and allows a user to view flat images on display 14. The ability to fold display 14 onto itself allows device 10 to exhibit an inwardly folding behavior. Display 14 may be sufficiently flexible to allow device 10 to be folded outwardly and/or inwardly.

Device 10 of FIG. 2 has a rectangular outline (rectangular periphery) with four corners. As shown in FIG. 2, a first pair of parallel edges (e.g., the left and right edges of device 10 in the example of FIG. 2) may be longer than a second pair of parallel edges (e.g., the upper and lower edges of device 10 of FIG. 2) that are oriented at right angles to the first pair of parallel edges. In this type of configuration, housing 12 is elongated along a longitudinal axis that is perpendicular to bend axis 28. Housing 12 may have other shapes, if desired (e.g., shapes in which housing 12 has a longitudinal axis that extends parallel to bend axis 28). With an arrangement of the type shown in FIG. 2, the length of device 10 along its longitudinal axis may be reduced by folding device 10 about axis 28.

Figure 3:
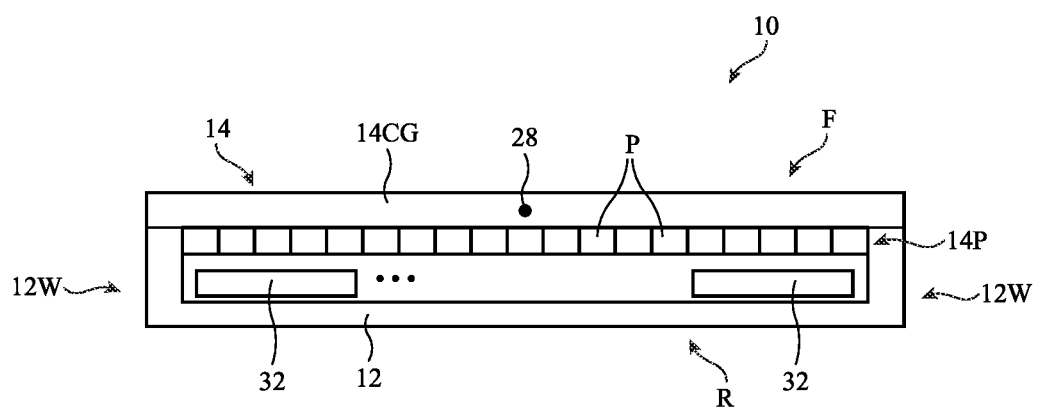
FIG. 3 is a cross-sectional side view of an illustrative electronic device in accordance with an embodiment.

FIG. 3 is a cross-sectional side view of an illustrative foldable electronic device. Device 10 of FIG. 3 may bend about bend axis 28. Bend axis 28 may be aligned with display cover layer 14CG or other structures in device 10. For example, bend axis 28 may pass through a portion of display cover layer 14CG or may be located above or below layer 14CG.

As shown in FIG. 3, display 14 includes an array of pixels P forming display panel 14P under an inwardly facing surface of display cover layer 14CG. Display panel 14P may be, for example, a flexible organic light-emitting diode display or a microLED display in which light-emitting pixels are formed on a flexible substrate layer (e.g., a flexible layer of polyimide or a sheet of other flexible polymer). Flexible support layer(s) for display 14 may also be formed from flexible glass, flexible metal, and/or other flexible structures.

Display cover layer 14CG may be formed from polymer, glass, crystalline materials such as sapphire, other materials, and/or combinations of these materials. To locally increase flexibility, a portion of layer 14CG that overlaps and extends along bend axis 28 may be locally thinned (e.g., this portion may be thinned relative to portions of layer 14CG that do not overlap bend axis 28). The thickness of layer 14CG (e.g., the non-thinned portions of layer 14CG) may be 50-200 microns, 70-150 microns, 100-200 microns, 100-600 microns, at least 100 microns, at least 200 microns, less than 600 microns, less than 400 microns, less than 250 microns, less than 150 microns, less than 100 microns, at least 50 microns, or other suitable thickness.

In the example of FIG. 3, housing 12 has a portion on rear face R that forms a rear housing wall and has side portions forming sidewalls 12W. The rear housing wall of housing 12 may form a support layer for components in device 10. Housing 12 may also have one or more interior supporting layers (e.g., frame structures such as an optional midplate, etc.). These interior supporting layers and the rear housing wall may have first and second portions that are coupled to opposing sides of a hinge that is aligned with bend axis 28 (see, e.g., hinge 30 of FIG. 2) or may be sufficiently flexible to bend around bend axis 28.

Electrical components 32 may be mounted in the interior of device 10 (e.g., between display 14 and the rear of housing 12. Components 32 may include circuitry of the type shown in FIG. 1 (e.g., control circuitry 20, communications circuitry 22, input-output devices 24, batteries, etc.). Display 14 may be mounted on front face F of device 10. When device 10 is folded about axis 28, display cover layer 14CG, display panel 14P, and the other structures of device 10 that overlap bend axis 28 may flex and bend to accommodate folding.

Figure 4:
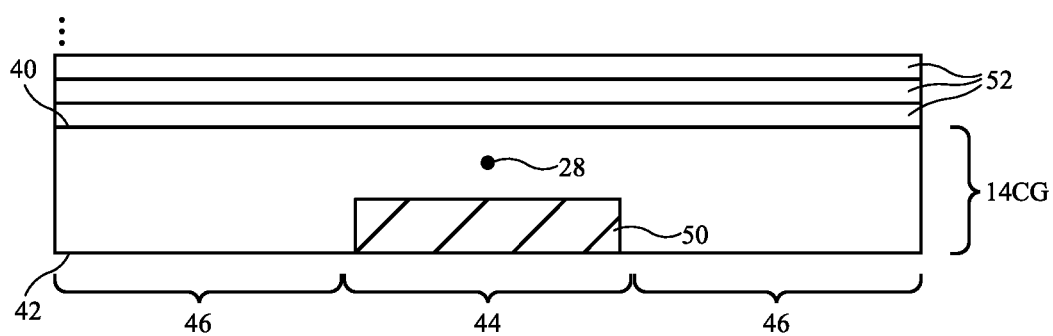
FIG. 4 is a cross-sectional side view of an illustrative display having a cover layer with a locally thinned hinge region in accordance with an embodiment.

The outer and/or inner surfaces of display cover layer 14GC may be provided with coatings. These coatings may include, for example, antireflection coatings, anti-scratch coatings, anti-smudge coatings, and/or other coating layers. Consider, as an example, the cross-sectional side view of display cover layer 14CG of FIG. 4. As shown in FIG. 4, display cover layer may have an outer surface (outwardly facing surface) such as surface 40 and an opposing inner surface (inwardly facing surface) such as surface 42. A strip-shaped region of display cover layer 14CG that overlaps and runs parallel to bend axis 28 may be locally thinned (e.g., a groove or other recess that runs parallel to bend axis 28 may be formed in layer 14CG to form locally thinned portion 44 of layer 14CG). Locally thinned portion 44 of layer 14CG may be thinner than other portions of layer 14CG such as non-thinned portions 46 (which may be, for example, planar glass layer portions of layer 14CG). The presence of portion 44 in display cover layer 14CG may facilitate bending of display cover layer 14CG about bend axis 28.

To help planarize inner surface 42 and thereby facilitate mounting of display panel 14P against inner surface 42 (e.g., with a layer of adhesive), the elongated recess (groove) in the inner surface of layer 14CG that forms thinned portion 44 may be filled with polymer 50. Polymer 50 may be sufficiently flexible to bend about bend axis 28 when device 10 is opened and closed. The refractive index of polymer 50 may be matched to that of display cover layer 14CG to help minimize light reflections (e.g., by incorporating inorganic nanoparticles in polymer 50). For example, at a wavelength of 500 nm, the refractive index of polymer 50 may differ from that of layer 14CG by less than 0.15, less than 0.1, or less than 0.05 (as examples).

Coating layers 52 may be formed on outer surface 40. Coating layers 52 may include, for example, anti-scratch layers (sometimes referred to as hard coats), protective polymer layers, anti-smudge layers, anti-fog layers, antireflection layers, anti-static layers, adhesion layers, and/or other coatings. In some configurations, each of these functions may be implemented using a separate respective coating layer. In other configurations, a single layer may serve multiple functions. In general, coatings such as coatings 52 may be formed on outer surface 40 and/or inner surface 42. In the illustrative configuration of FIG. 4, coatings 52 are formed on outer surface 40.

Coatings 52 may be provided in any suitable order. As one example, the lowermost coating of coatings 52 (e.g., a coating layer formed directly on surface 40 of FIG. 4) may be a hard coat or other anti-scratch layer that helps prevent scratches that could damage layer 14CG. An antireflection coating may be formed on top of the anti-scratch layer. The antireflection layer may be a thin-film interference filter antireflection coating containing a stack of thin-film layers such as dielectric sublayers of alternating refractive index. One of the thin-film layers may be a conductive layer such as a transparent semiconductor layer (e.g., an indium tin oxide layer) that serves as an antistatic layer. An anti-smudge coating or anti-fog coating may be formed on top of the antireflection layer. Anti-smudge coatings (e.g., hydrophobic polymer coatings) may help reduce fingerprints and other undesired marks on the surfaces of display 14. An example of an anti-smudge coating is a fluoropolymer coating (e.g., a fluoropolymer formed from evaporated perfluoropolyether) that serves as an oleophobic layer. Fluoropolymers can be adhered to underlying coating layers using an intervening adhesion layer.

Figure 5:
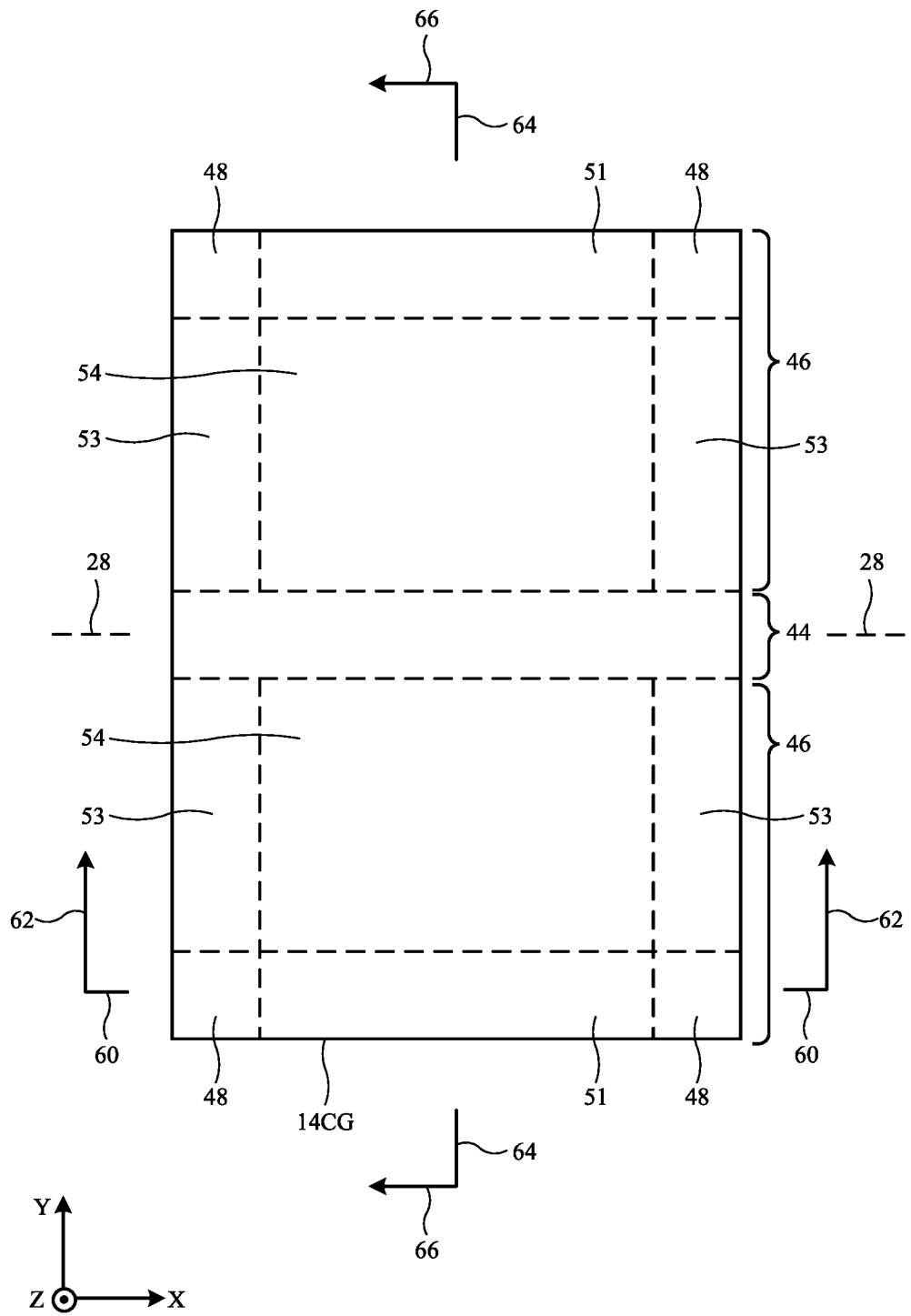
FIG. 5 is a top view of an illustrative display cover layer having a locally thinned portion that is aligned with a bend axis for a flexible display in accordance with an embodiment.

FIG. 5 is a top view of an illustrative display cover layer with a locally thinned portion. As shown in FIG. 5, thinned portion 44 may have an elongated shape formed by a groove that extends across the underside of display cover layer 14CG. Thinned portion 44 overlaps and extends along bend axis 28 and helps allow display cover layer 14CG to flex about axis 28.

During use of device 10, it is possible for device 10 to be exposed to stress. For example, during a drop event, display cover layer 14CG may strike a hard surface such as a floor. During such undesired drop events, the corners and edges of display cover layer 14CG typically make contact with the hard surface, while interior areas of the surface of display cover layer 14CG do not directly strike the hard surface or only strike the hard surface incidentally after the brunt of the impact has been borne by the edges. As a result, it is less likely for excessive impact-induced stress to display cover layer 14CG to occur in the central area of layer 14CG away from the four edges of layer 14CG than near the edges (e.g., the corners).

To help reduce the risk of impact-induced damage from drop events, it may be desirable to provide the portions of display cover layer 14CG at the corners and other edge locations with increased thickness (e.g., a thickness that is greater than the thickness of display cover layer in the central area adjacent to locally thinned portion 44). As shown in FIG. 5, for example, it may be desirable for the thickness of display cover layer 14CG to be greater at corner areas 48 and/or other edge areas such as end edge areas 51 and side edge areas 53 than in some or all of central area 54. In some illustrative arrangements, non-thinned portions 46 of display cover layer may have a thickness that increases as a function of increasing distance away from locally thinned portion 44 towards the ends of display cover layer 14CG. By selectively enhancing the thickness of display cover layer 14CG in non-thinned regions 46, the edges and corners of layer 14CG can be made thicker and more robust than other non-thinned portions of layer 14CG, thereby helping to increase the ability of display cover layer 14CG to resist impact damage.

Figure 6:
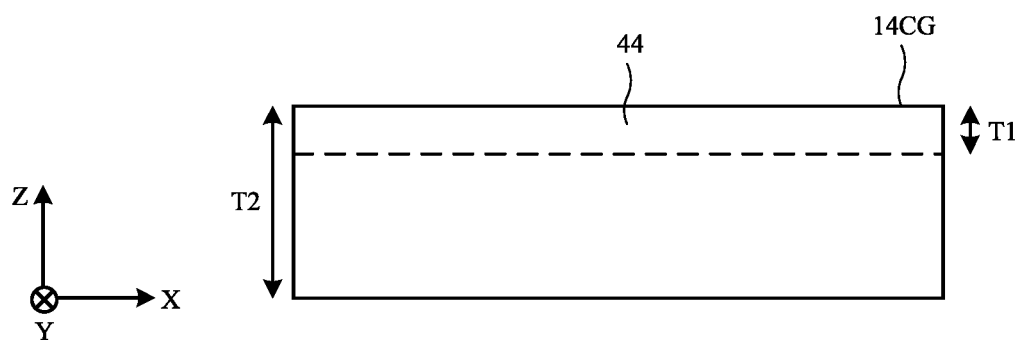
FIGS. 6 and 7 are cross-sectional end views of illustrative display cover layers with locally thinned portions in accordance with embodiments.
Figure 7:
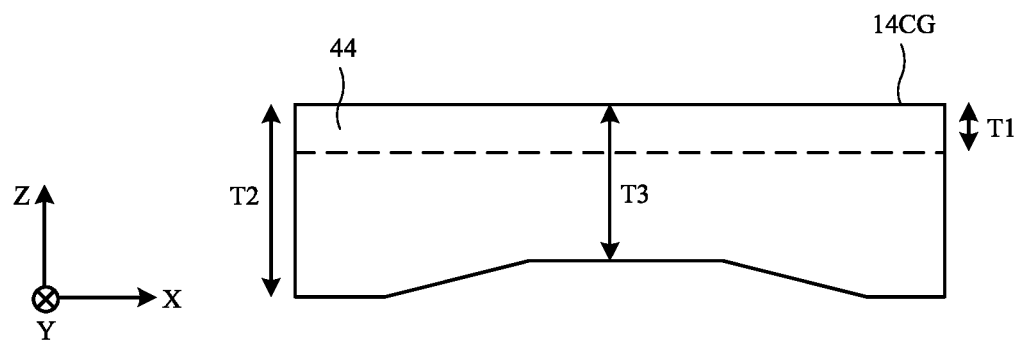

FIGS. 6 and 7 are cross-sectional end views of display cover layer 14CG in illustrative configurations in which the edge thickness of layer 14CG has been locally increased to help resist impact damage. FIG. 6 is a cross-sectional end view of layer 14CG taken along line 60 of FIG. 5 and viewed in direction 62. As shown in FIG. 6, the thickness T2 of display cover layer 14CG is uniform across the width of display cover layer 14CG and is greater than the thickness T1 of the thinned portion 44 of layer 14CG. In the illustrative configuration of FIG. 6, thickness T2 is also thicker than the thickness of display cover layer 14CG in the area of non-thinned portion 46 between end edge area 51 and the area of portion 46 that is immediately adjacent to portion 44. As shown in FIG. 7, which is a cross-sectional end view of another illustrative layer 14CG taken along line 60 and viewed in direction 62, layer 14CG may, if desired, have an increased edge thickness that is not uniform across the width of layer 14CG. In the example of FIG. 7, layer 14CG has thickness T2 at the left and right edges of layer 14CG (e.g., in the corners of layer 14CG) but has a smaller thickness T3 in the middle of layer 14CG (e.g., the thickness of layer 14CG is greater in corners 48 than in the center of end edge area 51). The outermost end edge of layer 14CG (e.g., the edge of layer 14CG viewed end on, rather than in cross section) may have a variable-thickness profile of the type shown in FIG. 7, may have a uniform-thickness profile of the type shown in FIG. 6, or other suitable thickness profile.

Figure 8:
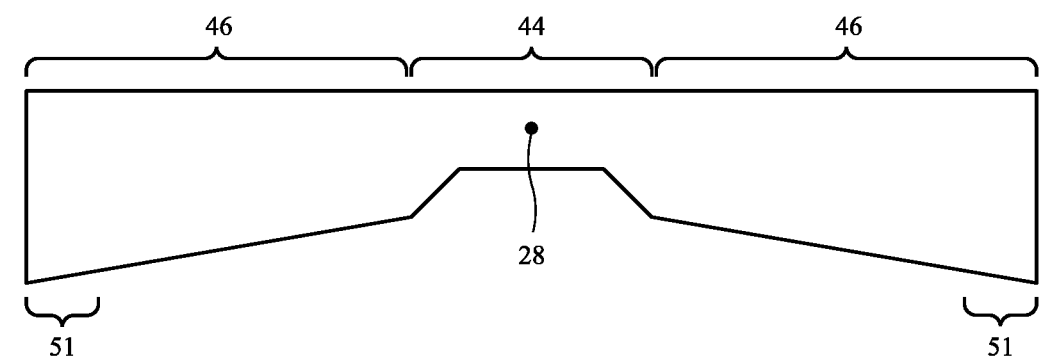
FIG. 8 is a cross-sectional side view of an illustrative display cover layer with a locally thinned portion that runs along a bend axis and end edge portions of enhanced thickness in accordance with an embodiment.

FIG. 8 is a cross-sectional profile of layer 14CG of FIG. 8 taken along line 64 of FIG. 5 and viewed in direction 66. In the illustrative configuration of FIG. 8, locally thinned portion 44 has a thickness that is reduced relative to non-thinned portions 46. Non-thinned portions 46 of FIG. 8 have a tapered cross-sectional profile and exhibit a thickness that increases from a minimum value near locally thinned portion 44 to a maximum value at the outermost end edge areas 51 of layer 14CG. This configuration enhances the end edge thickness of display cover layer 14CG (including, if desired, the corners of layer 14CG) relative to other portions of non-thinned portions 46 to help layer 14CG resist impact stress from a drop event.

Figure 9:
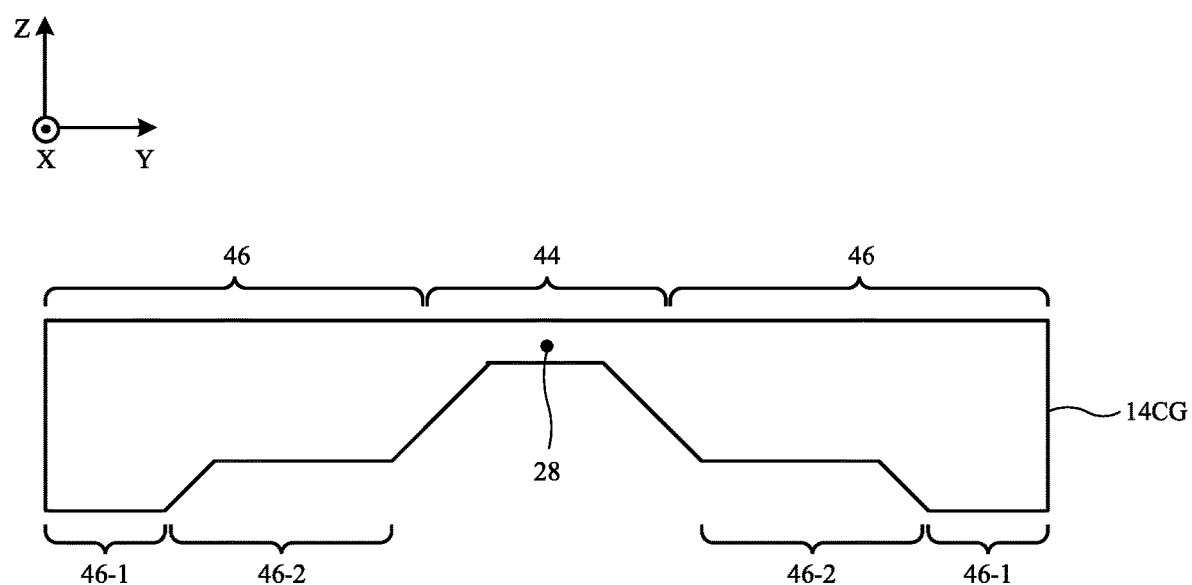
FIG. 9 is a cross-sectional side view of another illustrative display cover layer with a locally thinned portion that runs along a bend axis and edge portions of enhanced thickness in accordance with an embodiment.

In the example of FIG. 8, non-thinned portions 46 have tapered thickness profiles and increase in thickness linearly (or nearly linearly) as a function of distance from bend axis 28 towards the ends and end edges of layer 14CG. If desired, the thickness profile of layer 14CG may exhibit one or more different slopes along the length of layer 14CG. As shown in FIG. 9, for example, non-thinned portions 46 may have greater-thickness edge portions 46-1 along edge areas 51 and may have constant-thickness portions 46-2 that extend between the edge portions 46-1 and locally thinned portion 44. The thickness of layer 14CG of FIG. 9 may be constant across the width of layer 14CG (as described in connection with FIG. 6) or may vary across the width of layer 14CG (see, e.g., the illustrative configuration of FIG. 7). Using a thickness profile of the type shown in FIG. 9, the corners of layer 14CG and the edges of layer 14CG (particularly the end edges such as edge areas 51) may be provided with greater thickness relative to other non-thinned portions of layer 14CG (e.g., relative to non-thinned portions 46-2). Display panel 14P may overlap portions 46-1, portions 46-2, and portion 44 or may overlap only portions 46-2 and portion 44 (as examples). Polymer 50 may fill the recess under portion 44 and, if desired, may extend outwardly over portions 46-2 (and, if desired, portions 46-1) to planarize the entire inner surface of layer 14CG that is overlapped by panel 14P.

Figure 10:
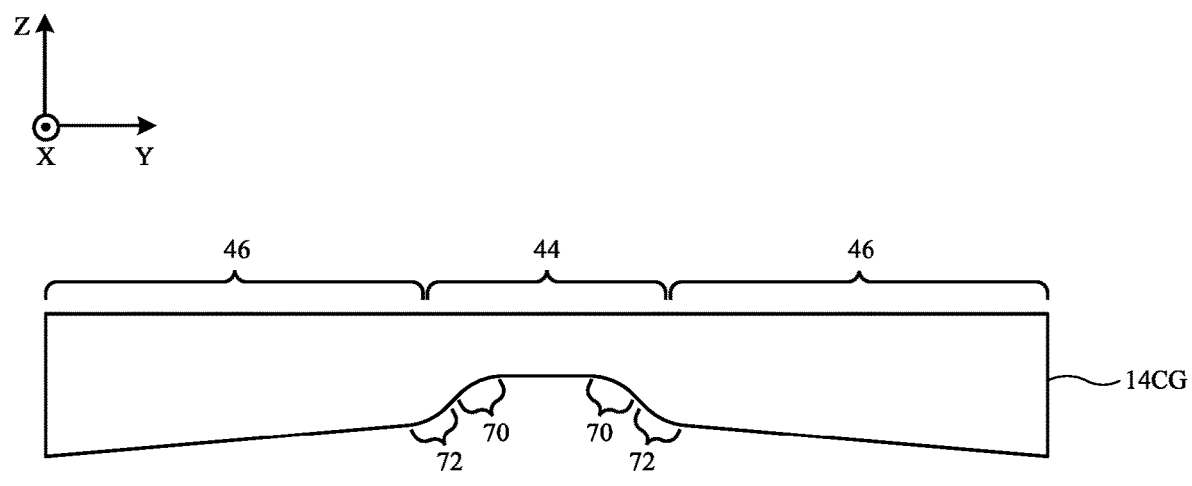
FIG. 10 is a cross-sectional side view of an illustrative display cover layer with a locally thinned portion characterized by an elongated recess having a cross-sectional profile with curved edges in accordance with an embodiment.

If desired, transitions between areas of different slope in the cross-sectional profile of layer 14CG may be provided with curved cross-sectional profiles. These curved profile shapes may help avoid stress concentrations due to abrupt thickness changes and can therefore help enhance the strength of display cover layer 14CG. Consider, as an example, the illustrative cross-sectional profile of display cover layer 14CG that is shown in FIG. 10. As shown in this illustrative configuration, the cross-sectional profile of layer 14CG may be provided with curved portions such as portions 70 at the transition between the centermost (thinnest) section of locally thinned portion 44 and the remainder of locally thinned portion 44 and such as portions 72 at the transition between locally thinned portion 44 and non-thinned portions 46. Smoothing out the thickness changes in layer 14CG at the transitions between areas of different slope (change in thickness per distance) may help increase the durability of layer 14CG. As shown in FIG. 10, portions 46 may also have tapered shapes or other shapes with increased edge thickness to help increase the resistance of layer 14CG to damage during drop events.

Figure 11:
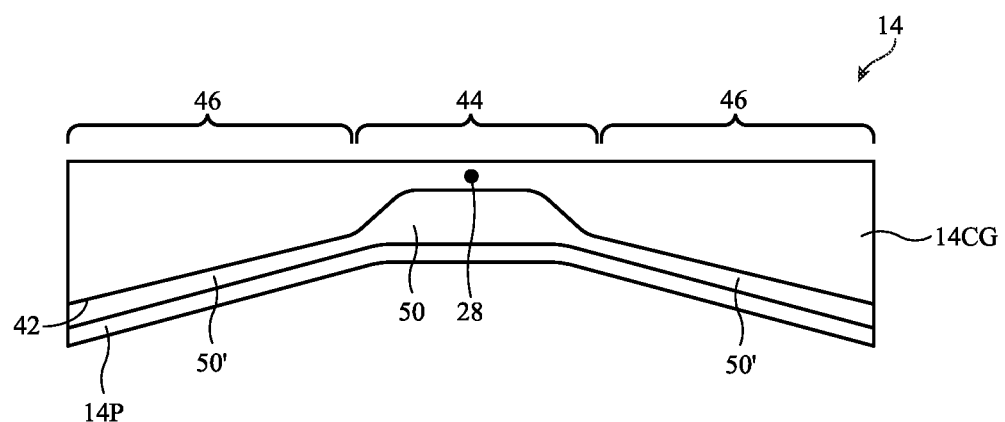
FIGS. 11 and 12 are cross-sectional side views of illustrative flexible displays in accordance with embodiments.
Figure 12:
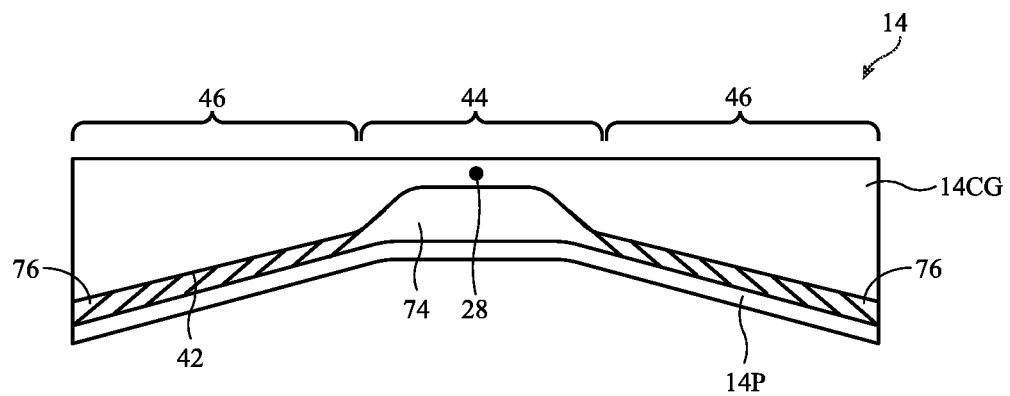

FIGS. 11 and 12 are cross-sectional side views of illustrative flexible displays showing how the recess in display cover layer 14CG may be filled with polymer 50 (FIG. 11) or air 74 (FIG. 12). As shown in FIGS. 11 and 12, display cover layer 14CG may have a groove the runs along bend axis 28 and forms locally thinned portion 44. Non-thinned portions 46 of FIGS. 11 and 12 have increased edge (and corner) thickness. Flexible display panel 14P has been attached to inner surface 42 of display cover layer overlapping bend axis 28.

In the example of FIG. 11, polymer 50 has been formed in the groove under locally thinned portion 44 to help smooth out the inner surface of display cover layer 14CG. Polymer 50 may be index matched to display cover layer 14CG. A layer of polymer (e.g., polymer 50') may be used in attaching display panel 14P to the inner surface of display cover layer 14CG. Polymer 50' may be an extended portion of polymer 50 or may be a separate polymer layer. Polymer 50' may conform to the taper or other profile of non-thinned portions 46 (as shown in FIG. 11) or may have an opposing taper or other profile that is configured to counteract the taper or other profile of non-thinned portions 46 so that the inner surface of polymer 50' lies in a single plane across all of display 14. Arrangements in which polymer 50' has a relatively uniform thickness so that the inner surface of polymer 50' follows the tapered profile of portions 46 are sometimes described herein as an example.

In the example of FIG. 12, the groove in display cover layer 14CG has been filled with air 74. A layer of polymer (e.g., polymer 76) may be used to attach the portions of display panel 14P that do not overlap air 74 to inner surface 42 of display cover layer 14CG.

To help display 14 avoid impact damage during an unexpected drop event, it may be desirable for device 10 and display 14 to fold slightly upon experiencing the forces associated with a drop. In a typical drop scenario, device 10 is jolted out of a user's hands or experiences other jolting forces just prior to impact with a floor or other hard surface. The attributes of display 14 and hinge 30 can be configured so that the folding behavior of device 10 in response to a sudden jolt helps to avoid a scenario in which device 10 strikes the ground while display 14 is fully deployed and flat. For example, device 10 can be configured to normally exert a slight opening force that helps hold device 10 and display 14 in a flat state during normal use (i.e., so that the angle between the left and right halves of device 10 is equal to 180°) while device 10 is resting in a user's hands. Device 10 can also be configured so that this slight opening force will be overcome by the jolting force that results when device 10 is knocked from a user's hands. When the slight opening force is overcome, the properties of display 14 and hinge 30 make it energetically favorable for device 10 and display 14 to fold inwardly. This folding action causes the angle A between the left and right halves of the device housing to take on a value of less than 180° (e.g., a value of A between 179° and 135°, a value less than 179°, or other suitable value) because device 10 is at least partly folded in on itself rather than being completely open. When device 10 finally strikes the ground, device 10 and display 14 will be partly folded, which helps ensure that only edge portions of display 14 and device 10 will be impacted. By configuring hinge 30 and/or the structures of display 14 (e.g., the air, polymer, or other substances in the groove of display cover layer 14CG and other display attributes) to help display 14 and device 10 fold in this way upon being jolted during a drop event, display 14 will be protected from scenarios in which display 14 is fully deployed (completely open and flat) and therefore more vulnerable to impact-induced damage.

Figure 13:
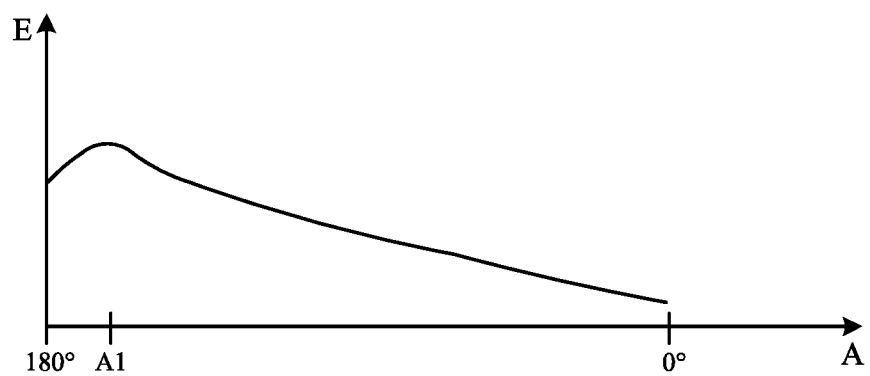
FIGS. 13 and 14 are graphs showing illustrative relationships between stored energy and display bending angle for electronic devices in accordance with embodiments.
Figure 14:
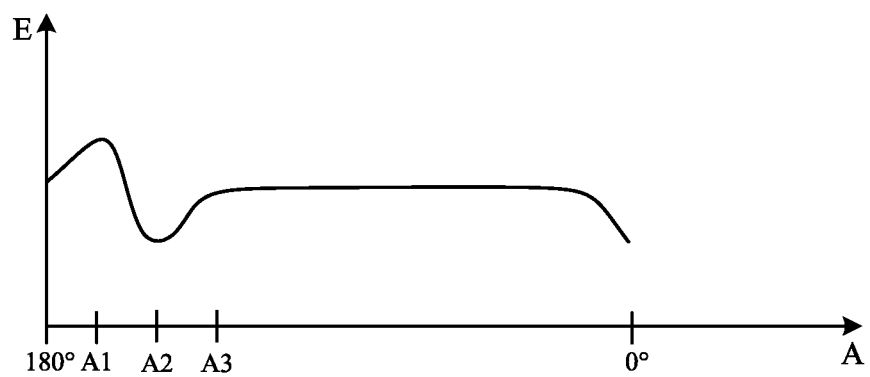

FIGS. 13 and 14 illustrate two possible characteristics for the folding behavior of device 10 that result from configuring hinge 30 and the layers of display 14 to promote folding of device 10 when jolted during a drop event. In the graphs of FIGS. 13 and 14, the amount of stored (potential) energy E in the springs and/or other structures of hinge 30 and display 14 is plotted as a function of folding angle A, where A=180° corresponds to a completely unfolded configuration and A=0° corresponds to a completely folded configuration in which the left and right halves of display 14 are folded to face one another.

In the example of FIG. 13, there is a small rise in stored energy E at angle A1. When device 10 is resting in a user's hands in an open state, the rise in energy E at angle A1 creates a slight restoring force that helps hold device 10 flat and completely open (with an angle A of) 180°. In the event of a jolt due to a drop event, the two halves of device 10 will fold by more than angle A1 and, in this example, will continue to fold towards each other during the drop. By the time device 10 strikes the ground, device 10 will have folded sufficiently to help avoid a flat impact between display 14 and the ground that could potentially damage display 14.

In the example of FIG. 14, there is also a small rise in stored energy E at angle A1, followed by a dip in stored energy at angle A2 (when device 10 is slightly folded) and then a subsequent rise in stored energy for larger angles (e.g., angles greater than A3). There may be a dip in stored energy near the fully closed position (A=0°) that helps hold the two halves of device 10 in a position facing each other when device 10 is closed. When fully opened, the rise in stored energy exhibit at angle A1 helps hold device 10 in its fully opened position for normal use. The dip in stored energy at angle A2 (e.g., relative to the larger amount of stored energy E at angles A1 and A3) creates a detent that helps cause device 10 to remain in this slightly folded orientation (A=A2) when jolted past angle A1 during a drop event. The slightly folded shape associated with folding angle A2 helps device 10 avoid excessive damage during a drop event. When a user desires to close device 10, the user can fold the left and right halves of device 10 together, overcoming the slight resistance to closing as angle A moves from A2 past angle A3.

Figure 15:
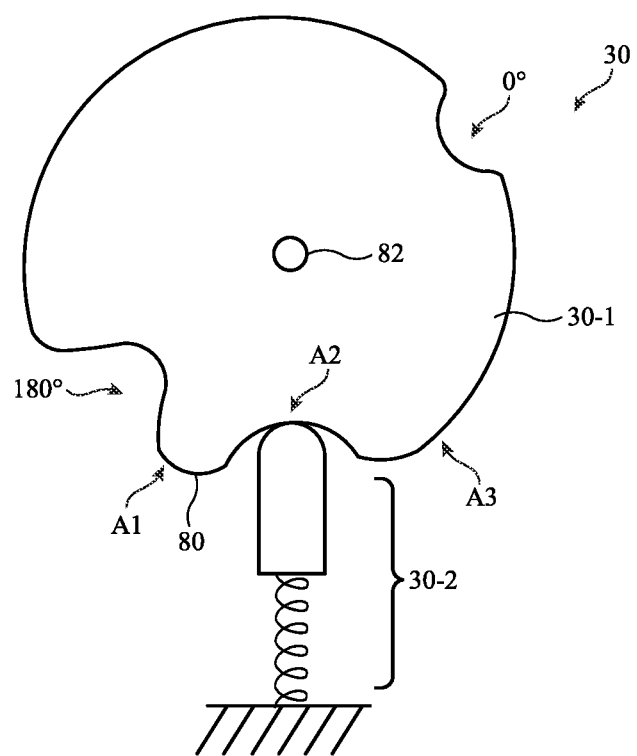
FIG. 15 is a cross-sectional side view of an illustrative hinge for a foldable electronic device in accordance with an embodiment.

The detent behavior of FIG. 14 may be implemented using any suitable display and hinge mechanisms. FIG. 15 is a side view of an illustrative configuration for hinge 30 based on a spring-loaded cam mechanism. As shown in FIG. 15, hinge 30 includes cam wheel 30-1 and spring-loaded pin 30-2. Wheel 30-1 is mounted on hinge shaft 82 and rotates relative to pin 30-2 as device 10 is folded and unfolded. Wheel 30-1 has a recessed portion corresponding to A=180° (the fully unfolded state of device 10), a protruding portion corresponding to angle A=A1, a recess corresponding to the detent at A=A2, a protruding portion corresponding to angles greater than A3, and a recess corresponding to the completely folded state (A=0°). When pin 30-2 is pressed outwards by the protruding portions of wheel 30-1, stored energy E rises and when pin 30-2 is allowed to move inwards by the recessed portions of wheel 30-1, the spring associated with pin 30-2 relaxes and stored energy E decreases. In this way, hinge 30 of FIG. 15 exhibits a behavior of the type shown in FIG. 14. If desired, other cam mechanisms and/or hinge and/or display structures of other configurations may be used to impart a folding device behavior of the type shown in FIG. 14 (or FIG. 13, etc.). The arrangement of FIG. 15 is illustrative.

Figure 16:
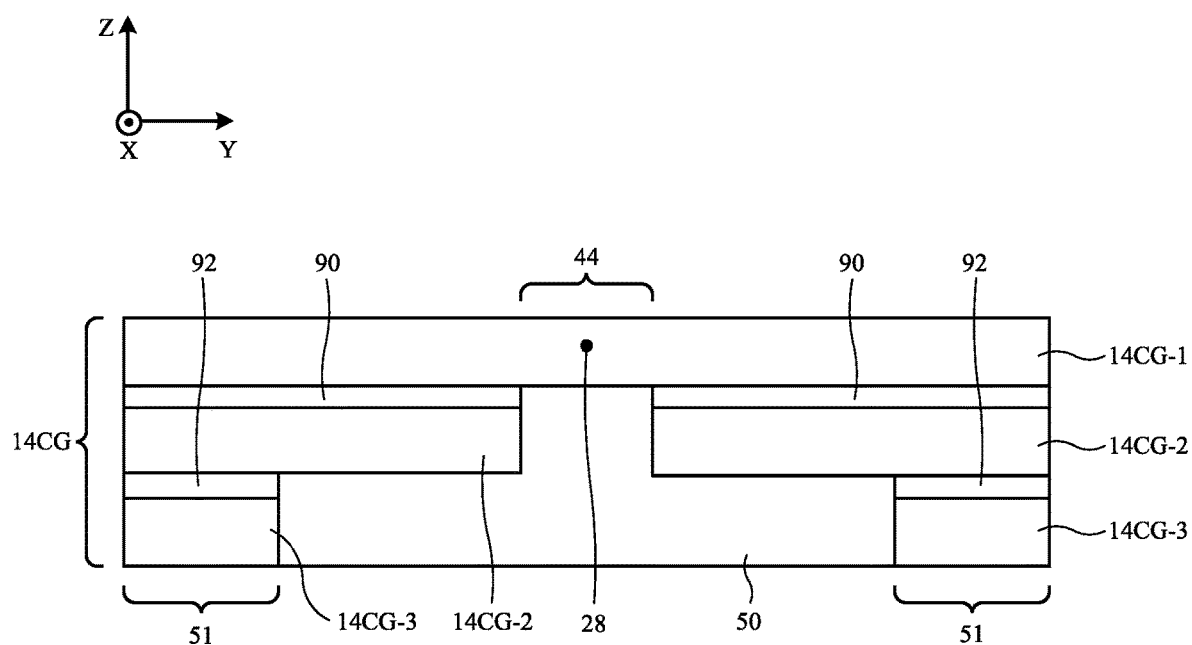
FIG. 16 is a cross-sectional side view of an illustrative display cover layer with a locally thinned portion formed by attaching layers of glass or other clear material together in accordance with an embodiment.

In the example of FIGS. 8 and 9, the increased thickness of the edge portions of display cover layer 14CG was created using a single layer of glass or other cover layer material. If desired, two or more layers of glass or other transparent material may be laminated together in a configuration that forms a locally thinned bending region and enhanced-thickness edges. Consider, as an example, the arrangement of FIG. 16. As shown in FIG. 16, display cover layer 14CG can be formed by laminating three layers of glass (or other transparent materials) together (e.g., glass layers 14CG-1, 14CG-2, and 14CG-3). Upper layer 14CG-1 may be attached to left and right halves of middle layer 14CG-2 by an interposed layer of polymer 90. The left and right halves of middle layer 14CG-2 may, in turn, be attached to first and second portions (e.g., left and right halves) of lower layer 14CG-3 by an interposed layer of polymer 92. Polymer layers 90 and/or 92 may be integral portions of polymer 50, which is used in filling the groove under locally thinned portion 44 that is formed by creating a gap between the left and right halves of layer 14CG-2 or layers 90 and/or 92 may be separate polymer layer (s) from polymer 50. If desired, layer 90 and/or layer 92 may be omitted (e.g., in configurations in which the layers of display cover layer 14CG are fused together without intervening polymer layers). Layer 14CG-3 may be patterned to enhance the thickness of only the end edges 51 of layer 14CG or parts of edge-thickness enhancement layer (s) such as layer 14CG-3 may extend along some of the side edges of layer 14CG (see, e.g., side edge areas 53 of FIG. 5). If desired, layers such as layers 14CG-2 and/or 14CG-3 may have tapered cross-sectional shapes or other profiles that help enhance side and/or end edge thickness relative to the thickness of other areas of non-thinned portion 46. The arrangement of FIG. 16 is illustrative.

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
    a foldable housing that is configured to bend about a bend axis;
    a flexible display panel that overlaps the bend axis; and
    a display cover layer overlapping the flexible display panel and through which the flexible display panel presents images, wherein the display cover layer has an outer surface that spans across the bend axis and has an inner surface facing the flexible display panel, wherein the display cover layer has a groove extending along the bend axis that forms a first portion of the display cover layer that is locally thinned and has a second portion that is thicker than the first portion, and wherein the second portion has regions of constant thickness and edge areas of greater thickness relative to the regions of constant thickness.

2. The electronic device defined in claim 1 wherein the second portion has a tapered cross-sectional profile.

3. The electronic device defined in claim 1 wherein the display cover layer has a length extending between opposing ends of the display cover layer and a width extending between opposing sides of the display cover layer and wherein the edge areas correspond to at least one of the opposing ends and the opposing sides.

4. The electronic device defined in claim 1 wherein the second portion is non-overlapping with the bend axis.

5. The electronic device defined in claim 1 wherein the display cover layer has a rectangular outline with four corner areas and wherein the edge areas include the four corner areas.

6. The electronic device defined in claim 1 wherein the display cover layer is configured to fold about the bend axis when jolted during a drop event.

7. The electronic device defined in claim 1 further comprising a hinge configured to couple first and second portions of the foldable housing for rotation about the bend axis, wherein the hinge is configured to cause the display cover layer to fold about the bend axis when jolted during a drop event.

8. The electronic device defined in claim 7 wherein the hinge is configured to exhibit a detent when the first and second portions are at an angular orientation associated with a partially folded state for the flexible display panel between a fully unfolded state and a fully folded state.

9. The electronic device defined in claim 1 further comprising air in the groove between the flexible display panel and the locally thinned portion.

10. The electronic device defined in claim 1 further comprising polymer in the groove between the flexible display panel and the locally thinned portion.

11. The electronic device defined in claim 1 wherein the display cover layer has a cross-sectional profile with a curved shape between the first and second portions.

12. The electronic device defined in claim 1 wherein the display cover layer has first, second, and third glass layers, wherein the first glass layer overlaps the bend axis, wherein the third glass layer forms the edge areas of greater thickness, and wherein the second glass layer is attached between the first and third glass layers and has a gap forming the groove.

13. A foldable display, comprising:
    a foldable array of pixels configured to fold about a bend axis, wherein the foldable array of pixels comprises a bending region that overlaps the bend axis; and
    a display cover layer overlapping the foldable array of pixels and through which the foldable array of pixels presents images, wherein the display cover layer has a first portion that is non-overlapping with the bending region, wherein the first portion has an edge area and an area that is thinner than the edge area, and wherein the display cover layer has a second portion formed from a recess that locally thins the display cover layer along the bend axis.

14. The foldable display defined in claim 13 wherein the first portion has a tapered cross-sectional profile and extends from a first location where the first portion has a first thickness to a second location where the first portion has a second thickness that is greater than the first thickness.

15. The foldable display defined in claim 14 wherein the second location is in the edge area.

16. The foldable display defined in claim 15 wherein the first location is located where the second portion joins the first portion.

17. The foldable display defined in claim 16 wherein the display cover layer comprises glass.

18. An electronic device, comprising:
    a foldable housing that is configured to bend about a bend axis;
    a flexible display panel that overlaps the bend axis; and
    a display cover layer overlapping the flexible display panel and through which the flexible display panel presents images, wherein the display cover layer has an outer surface that spans across the bend axis and has an inner surface facing the flexible display panel, wherein the display cover layer has a recess that extends along the bend axis, wherein the display cover layer has four corner areas, wherein the display cover layer is thickest in the four corner areas and thinnest at the recess, and wherein the display cover layer has portions that are interposed between the four corner areas and the recess and that are thinner than the four corner areas.

19. The electronic device defined in claim 18 wherein the portions that are interposed between the four corner areas and the recess are non-overlapping with the bend axis and the display cover layer comprises a layer of glass in which the recess is formed.

20. The electronic device defined in claim 18 wherein the display cover layer is formed from first, second, and third glass layers, wherein the second glass layer has a gap that forms the recess, wherein the first glass layer overlaps the bend axis, and wherein the third layer of glass does not overlap the recess and overlaps the four corner areas.

* * * * *